(12) United States Patent
Wang

(10) Patent No.: US 11,537,020 B2
(45) Date of Patent: Dec. 27, 2022

(54) ELECTROCHROMIC POLYAMIC ACID MATERIAL, PREPARATION METHOD THEREOF, AND DISPLAY DEVICE

(71) Applicant: Wuhan China Star Optoelectronics Semiconductor Display Technology Co., Ltd., Wuhan (CN)

(72) Inventor: Yamin Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 649 days.

(21) Appl. No.: 16/496,963

(22) PCT Filed: Jun. 14, 2019

(86) PCT No.: PCT/CN2019/091186
§ 371 (c)(1),
(2) Date: Sep. 24, 2019

(87) PCT Pub. No.: WO2020/232777
PCT Pub. Date: Nov. 26, 2020

(65) Prior Publication Data
US 2021/0333677 A1 Oct. 28, 2021

(30) Foreign Application Priority Data
May 21, 2019 (CN) .......................... 201910421827.2

(51) Int. Cl.
*H01L 51/50* (2006.01)
*G02F 1/1516* (2019.01)
(Continued)

(52) U.S. Cl.
CPC ..... *G02F 1/15165* (2019.01); *C08G 73/1032* (2013.01); *C08G 73/1042* (2013.01);
(Continued)

(58) Field of Classification Search
None
See application file for complete search history.

(56) References Cited

FOREIGN PATENT DOCUMENTS

| CN | 108586741 | 9/2018 |
|---|---|---|
| CN | 108822297 | 11/2018 |
| KR | 10-2016-0122432 | 10/2016 |

OTHER PUBLICATIONS

Yan. et al., Synthesis and Electrochemical Characterization of Polyamic Acid Containing Oligoaniline and Triphenylamine (Journal of Polymer Science, Part A Polymer Chemistry, 2017, 55, 1669-1673). (Year: 2017).*

(Continued)

*Primary Examiner* — Gregory D Clark
(74) *Attorney, Agent, or Firm* — PV IP PC; Wei Te Chung; Ude Lu

(57) ABSTRACT

The present invention provides an electrochromic polyamic acid material, a preparation method thereof and a display device, wherein the molecular structure of the electrochromic polyamic acid material includes oligoaniline and carbazolyl triphenylamine. The oligoaniline serves as an electrochemically sensitive group, and the carbazolyl triphenylamine serves as a fluorescence emitting group. The electrochromic polyamic acid material is an electrically controlled fluorescent polymer. Fluorescence intensity of the electrochromic polyamic acid material undergoes reversible fluorescence conversion with a change of an applied voltage, due to a redox reaction of the oligoaniline at different voltages, resulting in an interchange between a benzene ring and an anthracene ring in a molecular structure, and an electron/energy transfer path with the fluorescence emitting group are generated or eliminated, thereby realizing the electrically controlled fluorescent properties of the electrochromic polyamic acid material.

2 Claims, 2 Drawing Sheets

(51) Int. Cl.
    *C08G 73/10*     (2006.01)
    *C09K 11/06*     (2006.01)
    *G02F 1/157*     (2006.01)
    *G02F 1/163*     (2006.01)
    *H01L 27/32*     (2006.01)
    *H01L 51/00*     (2006.01)

(52) U.S. Cl.
    CPC .......... *C08G 73/1078* (2013.01); *C09K 11/06* (2013.01); *G02F 1/157* (2013.01); *G02F 1/163* (2013.01); *H01L 27/3232* (2013.01); *H01L 51/0035* (2013.01); *H01L 51/0043* (2013.01); *C09K 2211/1425* (2013.01); *C09K 2211/1433* (2013.01); *C09K 2211/1466* (2013.01); *H01L 51/5088* (2013.01); *H01L 2251/554* (2013.01)

(56) References Cited

OTHER PUBLICATIONS

CNKI "Abstract of Design and Synthesis of Aniline Fluorescent Polyamic Acid and Study on Its Properties", Chinese Master's Thesis Full Text Database Engineering Science and Technology I, 2019.

\* cited by examiner

ELECTROCHROMIC POLYAMIC ACID MATERIAL, PREPARATION METHOD THEREOF, AND DISPLAY DEVICE

RELATED APPLICATIONS

This application is a National Phase of PCT Patent Application No. PCT/CN2019/091186 having International filing date of Jun. 14, 2019, which claims the benefit of priority of Chinese Patent Application No. 201910421827.2 filed on May 21, 2019. The contents of the above applications are all incorporated by reference as if fully set forth herein in their entirety.

FIELD AND BACKGROUND OF THE INVENTION

The present invention relates to a field of display technology, and in particular, to an electrochromic polyamic acid material, a preparation method thereof, and a display device.

Polyaniline materials generally produce color changes when subjected to voltage. The principle is that polyaniline materials undergo redox reactions, forming different oxidation states, and voltage changes can be used to achieve reversible color changes, which provides a new guidance for display materials.

Among electrochromic polymers, polyaniline has been extensively studied for its ease of synthesis, high electroactivity, and reversible acid-base doping/dedoping. However, polyaniline-based electrochromic devices are still rare, mainly due to their limited solubility and poor processability. Therefore, there is an urgent need for new strategies for improving their solubility and processability.

SUMMARY OF THE INVENTION

An object of the present invention is to provide an electrochromic polyamic acid material including oligoaniline and a fluorescent triphenylamine moiety to solve problems such as poor solubility.

In order to solve the above technical problems, the present invention provides an electrochromic polyamic acid material including a molecular structure represented by formula below:

wherein the molecular structure of the electrochromic polyamic acid material includes oligoaniline and carbazolyltriphenylamine.

Further, the oligoaniline is an electrochemically sensitive group; and the carbazolyltriphenylamine serves as a fluorescence emitting group.

The present invention also provides a preparation method of an electrochromic polyamic acid material, including the following steps; providing a first compound including oligoaniline, a second compound including carbazolyltriphenylamine, 1,2,4,5-cyclohexanetetracarboxylic dianhydride, and a first solvent; mixing the first compound and the 1,2,4,5-cyclohexanetetracarboxylic dianhydride in a reaction vessel, and purging the reaction vessel with argon gas; adding the second compound and the first solvent to the reaction vessel to form a first mixed solution; magnetically stirring the first mixed solution at room temperature to carry out copolymerization reaction to obtain a second mixed solution; stirring the second mixed solution and pouring a second solvent into the reaction vessel to form a gray precipitate; washing the gray precipitate with water or the second solvent, followed by drying under vacuum to obtain the electrochromic polyamic acid material.

Further, the first compound is an electroactive diamine monomer; the second compound is 4,40-diamino-400-N-carbazolyltriphenylamine; the first compound, the second compound, and the 1,2,4,5-cyclohexanetetracarboxylic dianhydride have a molar ratio of 1:1:1 to 1.2:1:1.3.

Further, the first solvent includes N,N'-dimethylacetamide, dimethyl sulfoxide, N,N'-dimethylformamide, and N-methyl-2-pyrrolidone, and has a volume of 8 to 12 mL; and the second solvent includes methanol, and has a volume of 100 to 500 mL.

Further, in the step of magnetically stirring the first mixed solution at room temperature to carry out copolymerization reaction to obtain a second mixed solution, the copolymerization reaction is carried out for 24 to 96 hours.

Further, in the step of drying under vacuum to obtain the electrochromic polyamic acid material, a vacuum temperature is 300 to 475° C.

The present invention also provides a display device including the electrochromic polyamic acid material.

Further, the display device includes a first electrode; a hole injection layer disposed on the first electrode and made of a material including the electrochromic polyamic acid material; a hole transport layer disposed on the hole injection layer; a light emitting layer disposed on the hole transport layer; an electron transport layer disposed on the

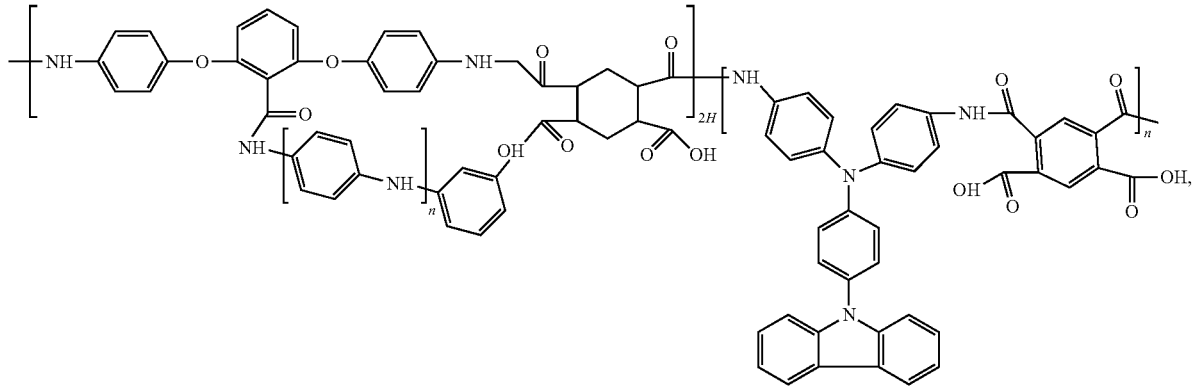

light emitting layer; an electron injection layer disposed on the electron transport layer; and a second electrode disposed on the electron transport layer.

Further, the first electrode is an anode made of indium tin oxide, and the second electrode is a cathode made of one of lithium fluoride and aluminum.

The present invention provides an electrochromic polyamic acid material, a preparation method thereof and a display device, wherein the molecular structure of the electrochromic polyamic acid material includes oligoaniline and carbazolyl triphenylamine. The oligoaniline serves as an electrochemically sensitive group, and the carbazolyl triphenylamine serves as a fluorescence emitting group. The electrochromic polyamic acid material is an electrically controlled fluorescent polymer. Fluorescence intensity of the electrochromic polyamic acid material undergoes reversible fluorescence conversion with a change of an applied voltage, due to a redox reaction of the oligoaniline at different voltages, resulting in an interchange between a benzene ring and an anthracene ring in a molecular structure, and an electron/energy transfer path with the fluorescence emitting group are generated or eliminated, thereby realizing the electrically controlled fluorescent properties of the electrochromic polyamic acid material.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

Figure 1:
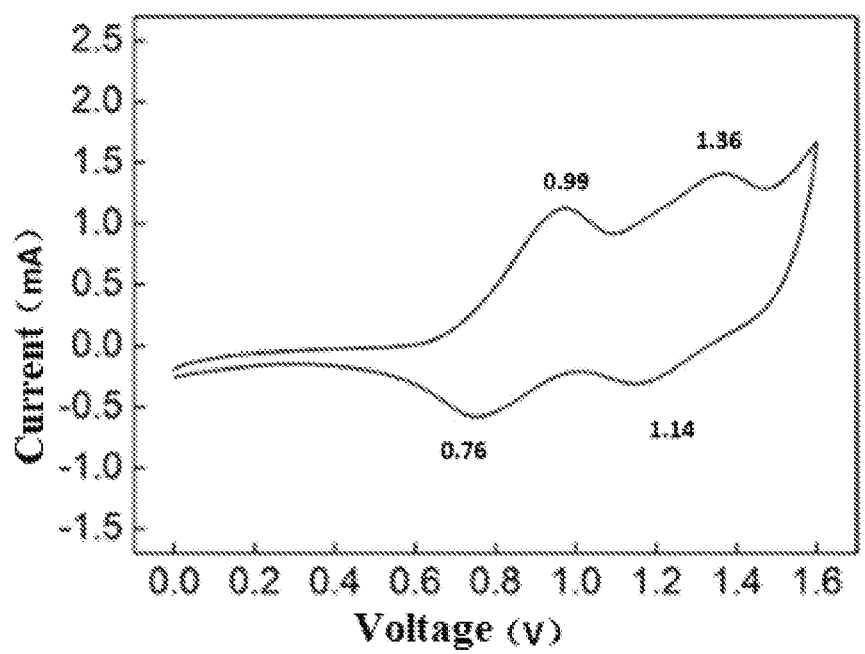
FIG. 1 is a cyclic voltammogram of an electrochromic polyamic acid material in ethanol according to the present invention.

Elements in the drawings are designated by reference numerals listed below:
Display device 10
First electrode 11
Hole injection layer 12
Hole transport layer 13
Light emitting layer 14
Electron transport layer 15
Electron injection layer 16
Second electrode 17.

DESCRIPTION OF SPECIFIC EMBODIMENTS OF THE INVENTION

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The names of the elements mentioned in the present invention, such as the first, second, etc., are only for distinguishing between different components and can be better expressed. In the drawings, like numbers refer to like elements throughout the description of the figures.

Embodiments of the present invention will be described in detail herein with reference to the drawings. The present invention may be embodied in many different forms, and the present invention is not to be construed as being limited to the specific embodiments set forth herein. The embodiments of the present invention are provided to explain the practical application of the present invention so that those skilled in the art can understand various embodiments of the present invention and various modifications suitable for the particular intended application.

The present invention provides an electrochromic polyamic acid material, including a molecular structure represented by formula below:

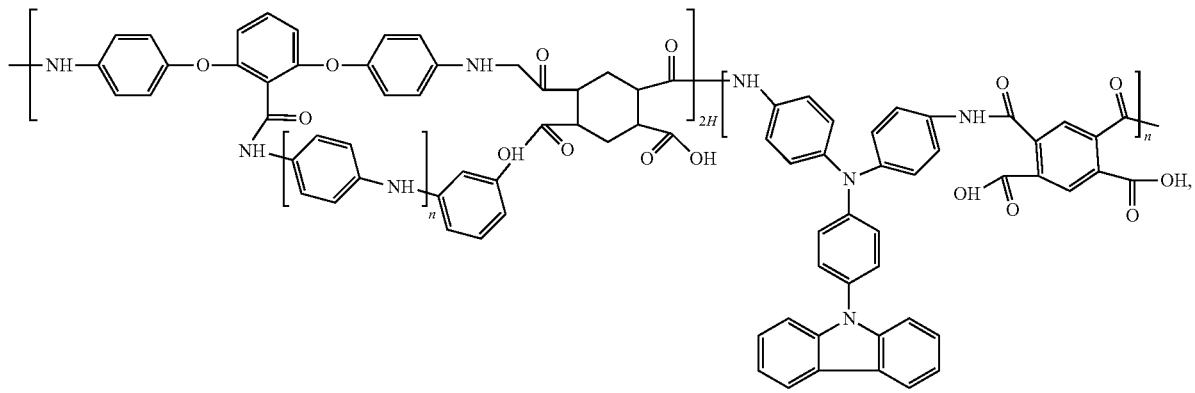

wherein the molecular structure of the electrochromic polyamic acid material includes oligoaniline and carbazolyltriphenylamine. The oligoaniline is an electrochemically sensitive group, and the carbazolyl triphenylamine serves as a fluorescence emitting group.

The electrochromic polyamic acid material is an electrically controlled fluorescent polymer. Fluorescence intensity of the electrochromic polyamic acid material undergoes reversible fluorescence conversion with a change of an applied voltage, due to a redox reaction of the oligoaniline at different voltages, resulting in an interchange between a benzene ring and an anthracene ring in a molecular structure, and an electron/energy transfer path with the fluorescence emitting group are generated or eliminated, thereby realizing the electrically controlled fluorescent properties of the electrochromic polyamic acid material.

In a solubility measurement, the electrochromic polyamic acid material is soluble in various solvents including N,N'-dimethylacetamide (DMAc), dimethyl sulfoxide (DMSO), N, N'-dimethylformamide (DMF), N-methyl-2-pyrrolidone (NMP), so it is very beneficial in practical applications.

In order to explain the present invention more clearly, the electrochromic polyamic acid material will be further explained below in conjugation with the method of preparing the electrochromic polyamic acid material of the present invention.

In an embodiment of the present invention, a method of preparing an electrochromic polyamic acid material of the present invention will be described in detail by taking a preparation of a target compound (an electrochromic polyamic acid material of the present invention) as an example.

The method of preparing an electrochromic polyamic acid material of the present invention includes the following steps S1 to S6.

S1) providing a first compound comprising oligoaniline, a second compound comprising carbazolyltriphenylamine, 1,2,4,5-cyclohexanetetracarboxylic dianhydride, and a first solvent.

The second compound is 4,40-diamino-400-N-carbazolyltriphenylamine, and the first compound is an electroactive diamine monomer;

The first compound, the second compound, and the 1,2,4,5-cyclohexanetetracarboxylic dianhydride have a molar ratio of 1:1:1 to 1.2:1:1.3.

S2) mixing the first compound and the 1,2,4,5-cyclohexanetetracarboxylic dianhydride in a reaction vessel, and purging the reaction vessel with argon gas.

S3) adding the second compound and the first solvent to the reaction vessel to form a first mixed solution.

The first solvent comprises N,N'-dimethylacetamide, dimethyl sulfoxide, N,N'-dimethylformamide, and N-methyl-2-pyrrolidone, and has a volume of 8 to 12 mL.

S4) magnetically stirring the first mixed solution at room temperature to carry out copolymerization reaction to obtain a second mixed solution.

S5) stirring the second mixed solution and pouring a second solvent into the reaction vessel to form a gray precipitate.

S6) washing the gray precipitate with water or the second solvent, followed by drying under vacuum to obtain the electrochromic polyamic acid material.

The second solvent comprises methanol, and has a volume of 100 to 500 mL. The vacuum temperature is 300° C. to 475° C.

In order to further illustrate properties of the electrochromic polyamic acid material, a simple verification was performed on the electrochromic polyamic acid material of the invention.

As shown in FIG. 1, the spin-coated electrochromic polyamic acid film on an indium tin oxide (ITO) substrate was used as a working electrode in a 0.1 M tetrabutylammonium perchlorate (TBAP) CH3CN solution, and a platinum electrode and an Ag/AgCl electrode are also introduced in a three-electrode arrangement as a counter electrode and a reference electrode respectively.

A capacitance-voltage (CV) curve of the electrochromic polyamic acid film showed two pairs of reversible redox peaks centered around 0.99 V & 0.76 V and 1.36 V & 1.14 V, respectively due to the reduced/oxidized state transition (oligoaniline segments) and neutral state/radical cation transition (nitrogen atoms of triphenylamine segments). The electrochromic polyamic acid film exhibits good electrochemical reversibility by continuous cyclic scanning between 0 and 1.8 V, which means that the electrochromic polyamic acid material has high electrochemical stability.

Figure 2:
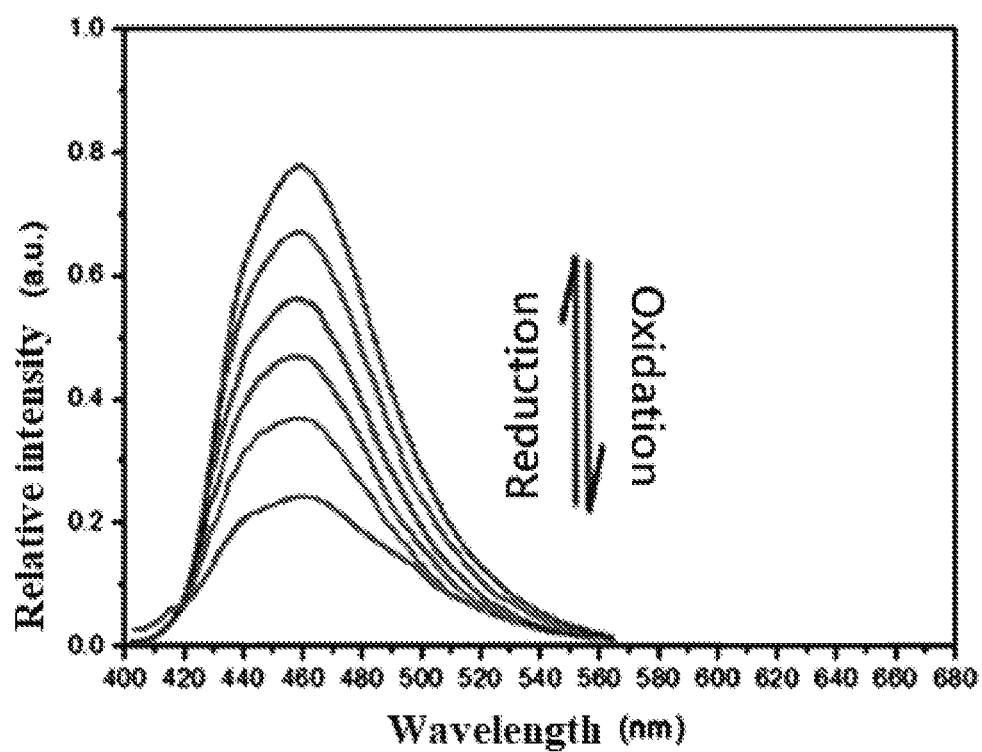
FIG. 2 is a fluorescence spectrum of an electrochromic polyamic acid material in an N,N'-dimethylacetamide solution according to the present invention.

As shown in FIG. 2, an emission peak was observed at a wavelength of 462 nm, and fluorescence intensity reached nearly 80%. After adding a quantitative oxidant (ammonium persulfate), the oxidation reaction was completed after 3 hours, and the fluorescence intensity eventually decreased to 30% of its original value, while there was no significant change of a position of the emission peak. Further, by adding a quantitative reducing agent (benzoquinone), the fluorescence intensity of the electrochromic polyamic acid solution was restored to its original value.

The fluorescence conversion characteristics of this redox species can be attributed to the fluorescence quenching effect of quinoline rings in the oligoaniline segment. The oxidant produces more anthracene rings in the oligoaniline segment, which will quench a portion of the fluorescence by the energy transfer that occurs between carbazole and oligoaniline. A reverse process may also occur when the electrochromic polyamic acid solution is reduced from an oxidized state to a reduced state.

The electrochromic polyamic acid material has been experimentally proven to have proud electrochemical stability and reversible color shift. In order to apply the electrochromic polyamic acid material to a light emitting device, the present invention also provides a display device including the electrochromic polyamic acid material.

Figure 3:
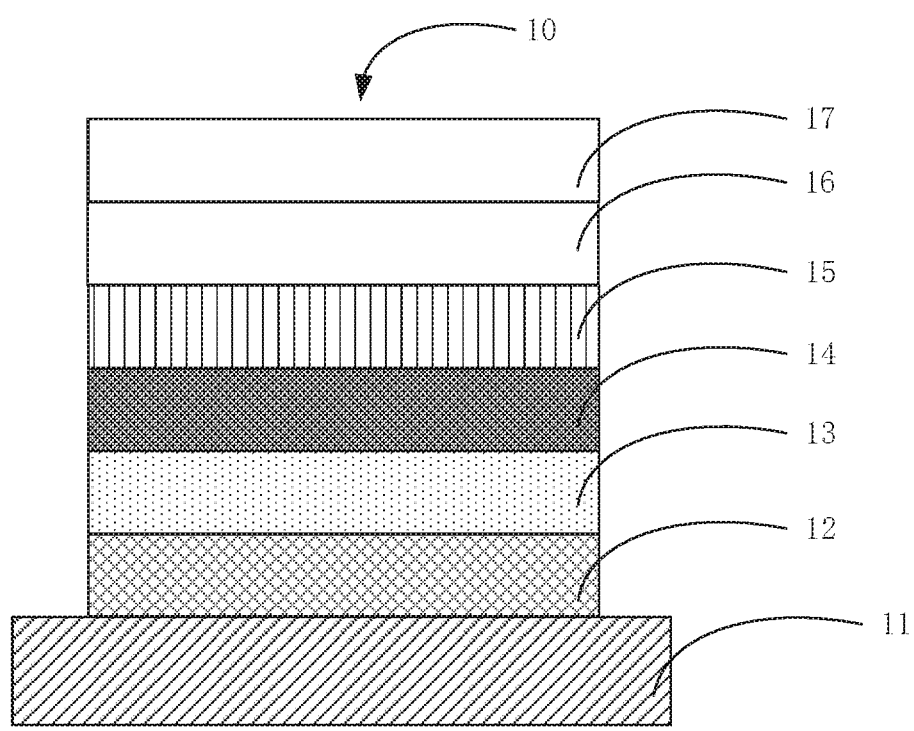
FIG. 3 is a schematic structural view of a display device according to the present invention.

Specifically, as shown in FIG. 3, the display device 10 includes a first electrode 11, a hole injection layer 12, a hole transport layer 13, a light emitting layer 14, an electron transport layer 15, an electron injection layer 16, and a second electrode 17.

The hole injection layer 12 is disposed on the first electrode 11; the hole transport layer 13 is disposed on the hole injection layer 12; the light emitting layer 14 is disposed on the hole transport layer 13 and made of a material including a modified perovskite quantum dot material; the electron transport layer 15 is disposed on the quantum dot light emitting layer 14; the electron injection layer 16 is disposed on the electron transport layer 15; and the second electrode 17 is disposed on the electron injection layer 16.

The hole injection layer is made of a material including the electrochromic polyamic acid material. The electrochromic polyamic acid material is an electrically controlled fluorescent polymer. Fluorescence intensity of the electrochromic polyamic acid material undergoes reversible fluorescence conversion with a change of an applied voltage, due to a redox reaction of the oligoaniline at different voltages, resulting in an interchange between a benzene ring and an anthracene ring in a molecular structure, and an electron/energy transfer path with the fluorescence emitting group are generated or eliminated, thereby realizing the electronically controlled fluorescent properties of the electrochromic polyamic acid material.

In this embodiment, the first electrode 11 is an anode made of indium tin oxide, and the second electrode 17 is a cathode made of one of lithium fluoride and aluminum.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display device, comprising an electrochromic polyamic acid material comprising a molecular structure represented by formula below:

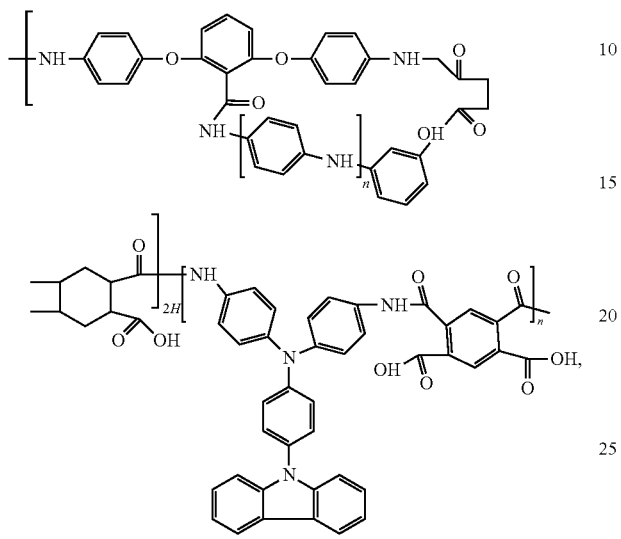

wherein the molecular structure of the electrochromic polyamic acid material comprises oligoaniline and carbazolyltriphenylamine, and the oligoaniline is an electrochemically sensitive group, and the carbazolyltriphenylamine serves as a fluorescence emitting group; and wherein the display device further comprises:
   a first electrode;
   a hole injection layer disposed on the first electrode and made of material comprising the electrochromic polyamic acid material;
   a hole transport layer disposed on the hole injection layer;
   a light emitting layer disposed on the hole transport layer;
   an electron transport layer disposed on the light emitting layer;
   an electron injection layer disposed on the electron transport layer; and
   a second electrode disposed on the electron transport layer.

2. The display device according to claim 1, wherein
the first electrode is an anode made of indium tin oxide, and the second electrode is a cathode made of one of lithium fluoride and aluminum.

* * * * *